United States Patent
Dinu-Gürtler et al.

(10) Patent No.: US 9,466,453 B2
(45) Date of Patent: Oct. 11, 2016

(54) CATHODE ARRANGEMENT, ELECTRON GUN, AND LITHOGRAPHY SYSTEM COMPRISING SUCH ELECTRON GUN

(71) Applicant: MAPPER LITHOGRAPHY IP B.V, Delft (NL)

(72) Inventors: Laura Dinu-Gürtler, Delft (NL); Eric Petrus Hogervorst, Haarlem (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 9 days.

(21) Appl. No.: 14/578,533

(22) Filed: Dec. 22, 2014

(65) Prior Publication Data
US 2015/0187533 A1    Jul. 2, 2015

Related U.S. Application Data

(60) Provisional application No. 61/921,546, filed on Dec. 30, 2013.

(51) Int. Cl.
*H01J 1/15* (2006.01)
*H01J 1/28* (2006.01)
(Continued)

(52) U.S. Cl.
CPC .......... *H01J 1/15* (2013.01); *G03F 7/70058* (2013.01); *H01J 1/28* (2013.01); *H01J 3/027* (2013.01); *H01J 3/029* (2013.01); *H01J 37/075* (2013.01);
(Continued)

(58) Field of Classification Search
CPC .............. H01J 37/075; H01J 37/3174; H01J 37/3177; H01J 37/063; H01J 29/481; H01J 2329/466; H01J 1/15; H01J 1/28
See application file for complete search history.

(56) References Cited

U.S. PATENT DOCUMENTS

| 1,201,138 A | 10/1916 | Bingham |
| 2,983,842 A | 5/1961 | Hrbek |

(Continued)

FOREIGN PATENT DOCUMENTS

EP    1 783 810 A2    5/2007

OTHER PUBLICATIONS

Getty et al., "High-Current-Density Cathode Operation and Beam Transport With Steady-State and Pulsed Cathode Heating Methods", p. 1129-1134., May 29, 1992.
(Continued)

*Primary Examiner* — Nicole Ippolito
*Assistant Examiner* — Sean Luck
(74) *Attorney, Agent, or Firm* — Hoyng Rock Monegier LLP; David P. Owen

(57) ABSTRACT

The invention relates to a cathode arrangement comprising:
 a cathode body housing an emission surface for emitting electrons in a longitudinal direction, wherein the emission surface is bounded by an emission perimeter;
 a focusing electrode at least partially enclosing the cathode body in a transversal direction and comprising an electron transmission aperture for focusing the electrons emitted by the emission surface, wherein the aperture is bounded by an aperture perimeter,
wherein the cathode body is moveably arranged within the focusing electrode over a maximum transversal distance from an aligned position,
and wherein the aperture perimeter transversally extends over the emission surface and beyond the emission perimeter over an overlap distance that exceeds the maximum transversal distance.

21 Claims, 8 Drawing Sheets

(51) Int. Cl.
  *H01J 37/075* (2006.01)
  *H01J 37/317* (2006.01)
  *G03F 7/20* (2006.01)
  *H01J 3/02* (2006.01)

(52) U.S. Cl.
  CPC ........ *H01J 37/3174* (2013.01); *H01J 37/3177* (2013.01); *H01J 2229/481* (2013.01); *H01J 2237/061* (2013.01)

(56) References Cited

U.S. PATENT DOCUMENTS

| | | | |
|---|---|---|---|
| 3,154,171 A | 10/1964 | Knutson et al. | |
| 3,154,711 A | 10/1964 | Beggs | |
| 3,175,115 A | 3/1965 | Drees et al. | |
| 3,227,906 A | 1/1966 | Kuehne | |
| 3,354,340 A | 11/1967 | Almer et al. | |
| 3,462,629 A | 8/1969 | Bell | |
| 3,474,282 A | 10/1969 | Katz et al. | |
| 3,573,533 A | 4/1971 | Gronlund | |
| 3,594,885 A | 7/1971 | Miram et al. | |
| 3,928,783 A | 12/1975 | Hosoki et al. | |
| RE30,082 E | 8/1979 | Atlee et al. | |
| 4,254,357 A | 3/1981 | Haas et al. | |
| 4,379,979 A | 4/1983 | Thomas et al. | |
| 4,644,219 A | 2/1987 | Huebner | |
| 5,218,263 A | 6/1993 | Falce et al. | |
| 5,293,410 A | 3/1994 | Felix et al. | |
| 5,536,944 A | 7/1996 | Tsunoda et al. | |
| 5,623,183 A | 4/1997 | Allen et al. | |
| 5,814,939 A * | 9/1998 | Chu | H01J 23/075 313/454 |
| 6,196,889 B1 * | 3/2001 | Mensinger | H01J 37/067 445/35 |
| 6,229,876 B1 | 5/2001 | Enck et al. | |
| 6,455,990 B1 * | 9/2002 | Mensinger | H01J 37/065 313/346 DC |
| 2003/0085360 A1 | 5/2003 | Parker et al. | |
| 2003/0218413 A1 | 11/2003 | Chiba | |
| 2004/0026628 A1 * | 2/2004 | Schweikhard | H01J 49/14 250/423 R |
| 2004/0090166 A1 * | 5/2004 | Sanders | H01J 35/14 313/448 |
| 2004/0091080 A1 * | 5/2004 | Garewal | H01J 35/30 378/119 |
| 2004/0150311 A1 * | 8/2004 | Jin | H01J 1/304 313/309 |
| 2004/0262539 A1 * | 12/2004 | Yui | H01J 37/065 250/492.1 |
| 2005/0052103 A1 * | 3/2005 | Katagiri | H01J 7/16 313/7 |
| 2007/0096620 A1 * | 5/2007 | Tymashov | H01J 3/02 313/446 |
| 2008/0315089 A1 | 12/2008 | Yasuda et al. | |
| 2009/0108192 A1 | 4/2009 | Groves | |
| 2009/0218508 A1 * | 9/2009 | Tamura | H01J 37/063 250/396 |
| 2011/0001421 A1 * | 1/2011 | Yamamoto | H01J 29/467 313/483 |
| 2011/0240855 A1 | 10/2011 | Ohshima et al. | |

OTHER PUBLICATIONS

Coane, "Introduction to Electron Beam Lithography", Louisiana Tech University, Institute for Micromanufacturing, p. 1-15, date unknown.

Zelechowski, "Experimental Tube for Investigating the Emission Properties of Thermionic Cathodes Working at High Temperatures", p. 859-860, Dec. 1967.

* cited by examiner

CATHODE ARRANGEMENT, ELECTRON GUN, AND LITHOGRAPHY SYSTEM COMPRISING SUCH ELECTRON GUN

CROSS REFERENCE TO RELATED APPLICATION

This application claims priority from U.S. application No. 61/921,546 filed on 30 Dec. 2013, which is hereby incorporated by reference in its entirety.

TECHNICAL FIELD

The invention relates to a cathode arrangement, an electron gun comprising such cathode arrangement, and a lithography system comprising such electron gun. Furthermore, the invention relates to a method for regulating a release of work function lowering particles from a surface within such cathode arrangement.

BACKGROUND ART

Electron guns typically comprise an electron emission source or cathode provided with an emission surface, a focusing electrode for directing the emitted electrons to a predetermined spatially confined trajectory, and one or more further electrodes for accelerating and deflecting the emitted electrons toward a target. An electron emission source may be of a thermionic cathode type. A thermionic cathode may be defined as a cathode heated by a heating element, for example an electrical filament, causing the cathode to release electrons with sufficient energy to overcome a work function of the material present on the emission surface. Generally, the focusing electrode is located relatively close to the emission surface of the cathode, and is at the same potential as the cathode. The shape of the focusing electrode is chosen such that emitted electrons emanating from the emission surface are repelled in a desirable fashion.

Dispenser type thermionic cathodes are a category of thermionic cathodes comprising measures for continuously replacing evaporated material. For example, a dispenser type thermionic cathode may comprise a cathode body with an internal reservoir filled with a material that, upon heating, cause work function lowering particles to diffuse from the reservoir to the emission surface. The presence of work function lowering particles at the emission surface lowers the minimum energy required for electron emission. Unfortunately, work function lowering particles diffused within a thermionic cathode may not only stimulate electron emission, but the particles, or reaction products formed from the particles, may deposit on surfaces of the focusing electrode. Deposition will for example occur when the work function lowering particles are positively charged Barium ions, while the focusing electrode is held at a negative potential for repelling the emitted electrons into an electron beam. Accumulation of work function lowering particles on the surface of the focusing electrode results in dimensional changes and possibly charging of the focusing electrode, which may significantly perturb the electric field applied for focusing the electrons. If the focusing electrode is located close to the cathode emission surface, any particle accumulation on the focusing electrode may also distort the emission distribution at the cathode emission surface. Furthermore, accumulation of particles on the focusing electrode may change its work function, which may lead to increased electron emission from the focusing electrode. These effects may have a negative impact on the quality of the generated electron beam.

In applications using thermionic cathodes, such as electron guns for electron beam lithography, a high and stable electron emission and current density from the cathode may be necessary. In order to achieve this, the alignment of the emission surface with respect to the focusing electrode is critical, as already a small misalignment may cause unacceptable changes in beam properties, such as beam current and/or current density.

SUMMARY OF INVENTION

It is desirable to provide a thermionic cathode with a good performance for a longer period of time, i.e., an improved lifetime. For this purpose, in a first aspect a cathode arrangement is provided, comprising: a thermionic cathode having an emission portion provided with an emission surface for emitting electrons and a reservoir for holding a material, which, when heated, releases work function lowering particles that diffuse towards the emission portion and emanate at the emission surface at a first evaporation rate; a focusing electrode comprising a focusing surface for focusing the electrons emitted at the emission surface of the cathode during use, and an adjustable heat source configured for keeping the focusing surface of the focusing electrode at a temperature at which accumulation of work function lowering particles on the focusing surface is prevented, or at least minimized.

The temperature of the focusing surface may be kept at or above a threshold temperature at which work function lowering particles are released, or evaporate, from the focusing surface at a second evaporation rate which is equal to or higher than the rate at which work function lowering particles arrive at the focusing surface.

Work function lowering particles will emanate from the emission surface due to the temperature of the emission surface during use of the cathode, and may deposit onto surfaces of the focusing electrode, in particular on the focusing surface. By keeping the focusing surface at a temperature at which the evaporation rate of work function lowering particles from the focusing surface is higher than the rate of arrival of work function lowering particles on the focusing surface, accumulation of work function lowering particles on the focusing surface can be avoided or at least minimized. Thereby, the lifetime of the cathode arrangement may be increased.

Alternatively or more specifically, a cathode arrangement is provided, comprising: a thermionic cathode having an emission portion provided with an emission surface for emitting electrons and a reservoir for holding a material, wherein the material, when heated, releases work function lowering particles that diffuse towards the emission portion and emanate at the emission surface at a first evaporation rate; a focusing electrode provided near the emission surface of the cathode, the focusing electrode comprising a focusing surface for focusing the electrons emitted at the emission surface of the cathode during use, and an adjustable heat source configured for keeping the focusing surface of the focusing electrode at a temperature above a threshold temperature that corresponds to a temperature at which a release of work function lowering particles from the focusing surface at a second evaporation rate equals an arrival rate of work function lowering particles at the focusing surface or equals the first evaporation rate.

The term "near" refers herein to a distance of about 1-15 microns (μm) between the emission portion of the cathode and a surface of the focusing electrode facing the emission portion. The focusing surface may be facing away from the cathode emission surface, and may in particular be oriented at an obtuse angle with respect thereto.

The emission portion may comprise a pellet, for example a porous matrix comprising Tungsten, located above the reservoir comprising the work function lowering particles. Alternatively, the cathode may comprise an impregnated pellet, wherein the pellet itself contains the work function lowering particles.

The focusing electrode, also referred to as Pierce electrode, may comprise a disc shaped portion having an electron transmission aperture bonded by an aperture perimeter at the smallest section of the transmission aperture. The aperture perimeter may preferably be arranged near the emission portion. A distance between a plane defined by the aperture perimeter, forming the smallest aperture of the transmission aperture, and a plane defined by the emission surface is preferably about 1-15 μm.

The focusing surface may form a truncated conical cutout, having a cone angle of about 138°. The angle formed between an inner electrode surface, facing the emission portion, and the focusing surface is often referred to as Pierce angle. The thickness of the focusing electrode portion bonded by the focusing surface and the inner electrode surface should be thin. The focusing surface, in particular the distance between the focusing surface and the emission portion of the cathode will strongly influence the trajectory of electrons emitted by the emission surface and thus also the properties of an electron beam generated by the cathode arrangement. Ideally, the trajectories of electrons emitted from the cathode should be substantially straight, along a substantially longitudinal direction away from the emission surface. A distance between the inner electrode surface and the emission portion may cause a bend, or curvature, in the trajectories of electrons emitted from the emission surface, which causes disturbance of the electron beam.

The transmission aperture may be smaller than the emission surface. If the transmission aperture perimeter and an emission surface perimeter are both circular, the transmission aperture perimeter may have a smaller diameter than the emission surface perimeter, typically on the range of 100-200 μm. For example, the transmission aperture may have a diameter of 1 mm, and the cathode emission surface a diameter of 1.2 mm. Thereby alignment requirements may be less critical. The current of emitted electrons may remain constant even if there is a small misalignment between the focusing electrode and the cathode.

In some embodiments, the thermionic cathode comprises a cathode body, also referred to as cathode housing, housing the emission portion and the reservoir. The emission portion may preferably be arranged such that the emission surface is substantially flush with a surrounding rim of the cathode body. The focusing electrode may comprise a heat trapping surface facing at least a portion of the cathode body, and arranged for receiving heat radiation emitted by the cathode body during use. The heat trapping surface thus has an extension such as to face at least a portion of the cathode body. The heat trapping surface is in thermal communication with the focusing surface. Preferably, the heat trapping surface at least partially surrounds an outer surface of the cathode body.

Preferably, the heat trapping surface of the focusing electrode is, on the time scale of typical thermal radiation fluctuations within the thermionic cathode, in good thermal contact with the focusing surface. The thermal contact may be achieved by making the focusing surface, the heat trapping surface, and their interconnecting portions from one or more materials with a high thermal conductivity, for example a metal such as Molybdenum, Zirconium or Titanium, or an alloy comprising Molybdenum, Zirconium and/or Titanium, for example a TZM alloy.

In some embodiments, one or more radial interspacings are defined between the heat trapping surface and an outer surface of the cathode body. The radial interspacings may reduce thermal conduction between the cathode body and the heat trapping surface of the focusing electrode. Reduced thermal conduction between the cathode body and the focusing electrode increases the relative influence of thermal radiation with respect to heat transfer between these two structures. Three, or more, radial spacers or tabs may be provided on the inside of the cylindrical shell for providing a radial interspacing between the cathode body and the heat trapping surface.

The heat trapping surface enables absorption of thermal radiation emitted by the cathode body during operation. The focusing surface of the focusing electrode is subsequently heated by thermal transfer from the heat trapping surface to the focusing electrode. The term "thermal radiation" refers herein to electromagnetic and energy effects related to heating, by means of radiation at, e.g., infrared and/or optical frequencies.

During operation, the cathode body is brought to a sufficiently high temperature in order for the emission portion to emit electrons at a desired rate. Various methods of heating the cathode body and the emission portion may be employed. Preferably, these methods effectuate heating of the cathode body and emission portion, while not directly heating the focusing electrode.

The adjustable heat source may provide for indirect heating of the focusing electrode, via heat radiation from the cathode body during use. The adjustable heat source may be provided for heating the cathode, in particular to a nominal temperature at which specified electron emission occurs.

By the design of the cathode arrangement, especially by the geometry and possibly by the materials, of the focusing electrode and the relative distances between the cathode body and the focusing electrode according to the embodiments described herein, the focusing surface may achieve the temperature defined above. In particular, a relation between an inner focusing electrode surface area, receiving heat radiated from the cathode body, and an outer focusing electrode surface area, providing cooling by thermal radiation from the focusing electrode, influences the temperature of the focusing electrode.

In some embodiments, the adjustable heat source may be arranged for heating the reservoir such that the work function lowering particles diffuse towards the emission portion and emanate at the emission surface at the first evaporation rate.

The adjustable heat source may comprise a heater cathode, which may be arranged to heat the reservoir of the cathode arrangement by means of electrons emitted from a heater cathode emission surface. The heater cathode may be arranged such that emitted electrons are focused, e.g. by a heater cathode focusing electrode, to a beam impinging on the thermionic cathode, or a portion thereof. The heater cathode may be configured for generating an electron beam with a beam current of about 1 to 10 mA.

Alternatively, the adjustable heat source may be arranged within the cathode body or within a receptacle formed by the cathode body. The adjustable heat source may comprise a heating filament arranged within the thermionic cathode in order to heat the reservoir and the cathode body. Alternatively, the adjustable heat source may comprise a laser, a laser light beam emitted by the laser being configured for heating the reservoir and the cathode body. Also in these configurations, the focusing electrode may be heated via thermal radiation from the cathode body.

Alternatively, the adjustable heat source may be arranged for directly heating the focusing electrode. This may be realized by a heater filament arranged within the focusing electrode, or by heating the focusing electrode by laser irradiation. Alternatively, the adjustable heat source may comprise a heater cathode arranged as above, and a portion of the electrons emitted by the heater cathode may be diverted toward the focusing electrode in order to directly heat this.

In some embodiments, the focusing electrode comprises a shell that surrounds the cathode body, the shell being provided with an inner surface, at least a portion thereof forming the heat trapping surface. The shell may be cylindrical.

Substantially the whole inner surface of the shell may form the heat trapping surface. Alternatively, one or more portions of the inner surface may form the heat trapping surface. The area of the heat trapping surface influences the amount of heat radiation that is absorbed by the focusing electrode. The focusing electrode may lose heat by thermal radiation from the outer focusing electrode surface. Therefore, the ratio between inner area and outer area of the focusing electrode influences the temperature of the focusing electrode. A relatively larger outer area means more cooling of the focusing electrode. In this way, for a fixed cathode temperature, depending on the focusing electrode geometry, a temperature in the range of 900K to 1300K of the focusing surface can be reached.

Therefore, by adjusting, e.g., the area of the heat trapping surface, its orientation with respect to the cathode body, for example the distance between the cathode body and the heat trapping surfaces, and the external surface area of the focusing electrode, the temperature of the focusing electrode, and thereby in particular the temperature of the focusing surface, can be adjusted.

One or more heat shielding elements may be arranged between the cathode body and the focusing electrode, and/or coatings or layers providing a lower heat absorption may be provided on the inner surface of the focusing electrode, in order to limit the amount heat radiation from the cathode body that reaches the focusing electrode. Thereby, the geometry of the focusing electrode, and thus its temperature, may be adjusted.

In some embodiments, the emission portion is provided with a non-emission surface surrounding the emission surface, wherein the focusing electrode comprises an inner electrode surface that faces the emission portion, and wherein at least one of the inner electrode surface and the non-emission surface comprises three spacing structures, also referred to as z pads, for providing a spacing between the focusing electrode and the emission surface.

The non-emission surface may comprise a rim of the cathode body surrounding and preferably being flush with the emission surface. The spacing structures may align a plane defined by the aperture perimeter and a plane defined by the emission surface substantially parallel to one another, with a longitudinal spacing. The spacing structures preferably have small dimensions compared to the emission portion so as to limit thermal conduction between the focusing electrode and the emission surface. The emission surface may for example have a surface area in the order of 0.5-6 square millimeters, while the largest cross-section of each spacer structure may be in the order of 0.01-0.1 square millimeter. The spacing structures preferably have a height of 1-10 μm and a width of about 100 μm. They may be made of the same material as the focusing electrode. Alternatively, they may comprise another material, for example aluminum (Al) or a thermally insulating material. The spacing structures may be substantially cylindrical. Alternatively, they may have other suitable shapes, e.g. pyramidal or frusto-conical.

By the three spacing structures, of small and defined dimensions, a stable and well defined distance and a controlled mechanical contact between the non-emission surface and the focusing electrode, especially the inner electrode surface, may be obtained. Thereby, thermal conduction between the emission portion and the focusing electrode may be limited.

The thermionic cathode and the focusing electrode are preferably arranged such that direct thermal conduction from the cathode, i.e. from the housing or the emission surface, to the focusing electrode is avoided or at least minimized. Thermal transfer from the cathode to the focusing electrode thus mainly occurs by thermal radiation. Heat transfer via thermal radiation is considered more stable and reproducible than heat transfer by thermal conduction. Thermal conduction depends on, e.g., contact pressure and contact area between connected structural elements.

In order to provide thermal stability of the mechanical contacts formed between the cathode body and the focusing electrode by the spacing elements, the spacing elements may comprise one or more blocking layers which do not allow sintering, the blocking layer preferably being electrically conductive. Alternatively, the mechanical contact may be formed via layers which allow sintering but are configured such that even if the degree of sintering increases with time, the degree of thermal conduction will not change.

Alternatively, a large contact area, for example a maximized contact area, may be provided between the non-emission surface and the inner electrode surface, such that even if sintering occurs during use of the cathode, thermal conduction between the cathode and the focusing electrode does not change in time.

The shell may comprise one or more angular interspacings for accommodating a confinement arrangement for confining the cathode body with respect to the focusing electrode and/or a support structure. These may be formed as slits or cut-outs in the shell structure.

The cathode arrangement may comprise a support structure provided with a confinement arrangement for confining, or limiting movement of, the focusing electrode and/or the cathode body with respect to the support structure. Thereby, the cathode body may be restrained with respect to the focusing electrode. The focusing electrode may be restrained with respect to the support structure. The support structure may comprise, or form part of, a support electrode in an electron gun described below.

The confining arrangement may comprise one or more end stops, having surface areas facing, but arranged at a distance from, one or more surface areas of the cathode body and/or focusing electrode. Physical contact between the confining arrangement and the cathode arrangement may thereby be avoided, minimizing thermal conduction between the cathode arrangement and the support structure. The confining arrangement may comprise one or more focusing electrode end stops and/or one or more cathode end stops.

The focusing electrode end stop and the cathode end stop may be a monolithic unit, or may be comprised in separate structures.

By this arrangement, when the cathode is positioned in the orientation intended during use, the cathode body is resting on the inner electrode surface, in particular on the spacing structures, by means of gravity. Similarly, the focusing electrode rests on the support structure by means of gravity. In this orientation, the end stops are arranged at a distance from surfaces of the cathode arrangement. However, if the cathode arrangement, together with the support structure, would be tilted with respect to the intended orientation, e.g. turned upside down, the end stops will prevent the elements of the cathode arrangement from falling apart and from falling out of the support structure.

The work function lowering particles may comprise Barium. In this case, the adjustable heat source is preferably configured to keep the temperature of the focusing surface of the focusing electrode above a threshold temperature of 900K. Keeping the focusing surface temperature above 900K the rate at which Barium, which may have been deposited on the focusing surface, evaporates from the focusing surface is higher than the rate at which Barium particles, which have emanated from the emission surface, arrive at the focusing surface. As a result, accumulation of Barium particles on the focusing surface is reduced. Especially, it may be reduced to a single monolayer. Ideally, deposition, and eventually accumulation, of Barium particles may be avoided.

Although it is desired to keep the focusing electrode at an elevated temperature in order to avoid contamination thereof, increasing the focusing electrode temperature increases the probability of electron emission from the focusing surface. The temperature of the focusing surface should be lower than the temperature of the cathode body.

In some embodiments, the adjustable heat source is further configured to keep the temperature of the focusing surface below a further threshold temperature of 1300 K. By keeping the electrode temperature below 1300 K, preferably in combination with the focusing surface having been carbonated or coated with a work function increasing coating, a current of electrons that are emitted by the focusing electrode remains below 0.01-0.1% of the electron current emitted by the emission surface of the cathode.

The focusing surface may have been exposed to a treatment which increases the work function at temperatures above 1100 K. Thereby, the electron emission may be suppressed also at temperatures above 1100K. For example, the focusing electrode, or at least the focusing surface, may be made of, or may be coated with, an electron emission suppressing coating. The focusing electrode, in particular the focusing surface, may be coated with Zirconium or an alloy comprising Titanium-Zirconium-Molybdenum. Alternatively, the focusing surface may be carbonated.

Some embodiments of the invention relate to a focusing electrode comprising a cylindrical shell defining a cavity for accommodating a cathode body, and a front cover provided with a circular electron transmission aperture and a focusing surface on an outer surface, wherein a heat trapping surface is provided on an inner surface of the cylindrical shell. The shell may be considered to surround an inner void, or cavity, for accommodating a cathode, such as a thermionic cathode. By a circular aperture, a symmetric electron beam may be generated. This focusing electrode may be the focusing electrode of any one of the cathode arrangements described herein.

The cylindrical shell may comprise angular interspacings for accommodating a confinement arrangement for confining the focusing electrode and/or the cathode body with respect to a support structure. This may be a confinement arrangement as described above.

The focusing surface is preferably oriented at an angle to the inner electrode surface of the front cover, whereby an acute angle is formed at the electron transmission aperture, as described above. Thus, the focusing surface and the inner electrode surface converge at the transmission aperture.

The focusing electrode may be provided with three spacing structures on the inner electrode surface for providing a spacing between the focusing electrode and the cathode body. These spacing structures may be similar or identical to the spacing structures described above with reference to the cathode arrangement.

The focusing electrode may be provided with radial spacers on the inside of the cylindrical shell for providing one or more radial interspacings between the cathode body and the focusing electrode. Preferably, three or four radial spacers are provided.

A method for regulating a release of work function lowering particles from a surface is provided. The method comprises providing a cathode arrangement according to any one of the embodiments described above, and keeping the temperature of the focusing electrode above a threshold temperature corresponding to a release of work function lowering particles from the focusing surface at an evaporation rate that equals an evaporation rate of work function lowering particles arriving at the focusing surface or emanating from the emission surface of the cathode. That is, the focusing electrode is kept at a temperature at which an evaporation flux of work function lowering particles and/or their reaction products equals the arrival rate at the focusing surface of work function lowering particles emanating from the emission surface of the cathode. Preferably, the focusing surface may be kept at a temperature at which the evaporation rate of work from the focusing surface is higher than the deposition rate of work function lowering particles and/or their reaction products onto the focusing electrode. Preferably, the focusing surface is kept at the lowest possible temperature at which this occurs.

The method may comprise keeping the temperature of the focusing electrode below a further threshold temperature corresponding to a first electron current density created by emission of electrons from the focusing surface that is 0.01-0.1% of a second electron current density created by emission of electrons from the emission surface of the cathode.

The work function lowering particles may comprise Barium. The method may comprise keeping the temperature of the focusing electrode between 900 K and 1300 K during use of the cathode arrangement.

In order to obtain a high and stable current density of an electron beam generated by an electron gun comprising a cathode arrangement, the alignment of the cathode with respect to the focusing electrode is important. According to a second aspect, a cathode arrangement is provided, which comprises:

a cathode body housing an emission surface for emitting electrons in a longitudinal direction, wherein the emission surface is bounded by an emission perimeter; and a focusing electrode at least partially enclosing the cathode body in a transversal direction, and comprising an electron transmission aperture near the emission surface for focusing the electrons emitted by the emission surface during operation, wherein the aperture is bounded by an aperture perimeter.

The cathode body is moveably arranged within the focusing electrode over a maximum transversal distance from an aligned position, and the aperture perimeter transversally extends over the emission surface and beyond the emission perimeter over an overlap distance that exceeds the maximum transversal distance.

The cathode of the cathode arrangement according to the second aspect may be a thermionic cathode, as described with reference to the first aspect.

The focusing electrode may be heated, such as to avoid accumulation of work function lowering particles on the focusing electrode, in a similar manner as discussed above with respect to the first aspect.

The emission perimeter may be formed by a border or interface between the emission surface and a surrounding rim of the cathode body. The emission surface is preferably flush with the rim of the cathode body. The emission surface may be comprised in a cathode pellet, for example a porous pellet arranged over a reservoir comprising work function lowering particles as described with respect to embodiments of a cathode arrangement according to the first aspect.

The aperture perimeter is positioned radially inside of the emission perimeter. That is, the emission perimeter encloses a larger surface area than the aperture perimeter. The emission surface is thus larger than the area of the aperture perimeter. In other words, the focusing electrode transversally extends over the emission surface, beyond the emission perimeter. Since the overlap distance is larger than the maximum transversal distance, related to the maximum amount of play, possible for the cathode body within the focusing electrode, the aperture will always be fully positioned over the emission surface. That is, even if the cathode body is not in the perfectly aligned position with respect to the focusing electrode, this will not influence the current of electrons emitted by the cathode. This way, even if the cathode body deviates from the aligned position, the electron transmission aperture will be fully projected onto the emission surface, seen in the longitudinal direction.

The maximum transversal distance is preferably in the range of 10 to 35 µm, more preferably about 10-15 µm. The maximum transversal distance is the distance the cathode body can move from the central aligned position.

The overlap distance may be in a range of 10 µm to 100 µm, and may preferably be equal to 50 µm. Thereby, mechanical tolerances may be relaxed from about 1 µm for a cathode arrangement where the transmission perimeter is equal in size to the emission perimeter, to about 50 µm.

As described above, the focusing electrode may be arranged such that an inner electrode surface of the focusing electrode facing the emission portion, may be positioned at a distance of 1 to 15 µm, preferably 1 µm or 5 µm, from the emission surface or a rim of the cathode body flush with the emission surface. The focusing electrode may be a focusing electrode as described above with reference to the first aspect.

The aperture perimeter and the emission perimeter may be similarly shaped, and preferably are circular. A circular aperture perimeter enables formation of a symmetrical electron beam.

The focusing electrode preferably has an inner electrode surface facing the emission surface, and three spacing elements arranged for providing a spacing between the focusing electrode and the emission portion. These spacing elements may be spacing elements as described above.

Radial spacers, or tabs, preferably three or four, may be provided on an inner surface of a cylindrical shell formed by the focusing electrode, for providing an annular gap between the inner surface of the cylindrical shell and the cathode body.

According to a third aspect, a focusing electrode is provided. The focusing electrode comprises a cylindrical shell defining a cavity, for accommodating a cathode having a cathode body, and a front cover located at a first end of the cylindrical shell, the front cover having an inner electrode surface, a focusing surface, and an electron transmission aperture. The cylindrical shell is provided with angular interspacings for accommodating a confining arrangement for confining the focusing electrode and/or the cathode body with respect to a support structure.

The focusing electrode of the first and/or second aspect may be a focusing electrode according to the third aspect. The different features, embodiments and advantages described above for the focusing electrode according to the third aspect may therefore be similar to the features described above for the first and second aspects. The confinement arrangement may be a confinement arrangement as discussed above with respect to the first aspect.

The angular interspacings may be provided by slits or cut-outs in the shell structure. The cut-outs may extend from a second end of the cylindrical shell and ending at a distance from the first end. This distance is preferably larger than a dimension of the first end of the cathode body along the longitudinal direction. Thereby, a distance may be provided between end stops of a confining arrangement arranged to protrude through the angular interspacings and facing a surface of the cathode body.

The focusing surface may be arranged by a conical cut-out in the front cover. The focusing surface and the inner electrode surface may converge at the transmission aperture, to form a transmission aperture perimeter.

The inner electrode surface may be provided with three spacing elements adapted to support cathode front surface, in particular a non-emission surface surrounding an emission surface. As described above, the spacing structures are configured for aligning a plane defined by the emission surface parallel to a plane defined by the transmission aperture.

The cylindrical shell may be provided with support elements extending from the cylindrical shell. The support elements and the support structures may be configured such that the focusing electrode rests, by means of gravity, on the support structure via three substantially point contacts formed between three support elements and the support structure. Further support elements may be provided, confining transversal movements of the focusing electrode and/or a rotation of the focusing electrode around the longitudinal axis.

According to a fourth aspect, a cathode arrangement comprises a source cathode arrangement and a heater cathode arrangement is provided. The source cathode arrangement may be a cathode arrangement according to any embodiment of the first or second aspect.

The source cathode arrangement comprises a cathode body and an emission portion provided with an emission surface for emitting electrons, and a reservoir or a pellet comprising a material for releasing work function lowering particles when heated, the reservoir and/or pellet being configured such that work function lowering particles diffuse towards the emission surface. The heater cathode arrangement comprises a heater cathode configured to heat a portion of the cathode body such that the material releases work function lowering particles and that the emission surface emits electrons.

The heater cathode arrangement may comprise a focusing electrode arranged to converge electrons emitted from the heater cathode into an electron beam. The heater cathode and the source cathode are preferably arranged with respect to each other such that the electron beam generated by the heater cathode arrangement is focused in a volume enclosed by a portion of the cathode body, referred to as receptacle. The receptacle is arranged with an innermost end surface facing the reservoir or pellet of the source cathode arrangement. The receptacle may form a hollow cylinder, closed at one end by the innermost end surface, and having a depth such as to minimize the amount of electrons escaping from the receptacle.

The heater cathode arrangement and the source cathode arrangement are preferably coaxially aligned along a longitudinal axis. Especially, the heater cathode focusing electrode may be coaxially aligned with the cathode body, and/or with a source cathode focusing electrode.

The heater cathode may comprise a thermionic cathode, such as an I-type thermionic cathode, e.g. a cathode comprising an impregnated pellet. The heater cathode may be heated by a filament wire. The heater cathode may be a standard thermionic cathode.

The source cathode arrangement may function as an anode for the heater cathode arrangement. A potential difference on the order of 1 kV may be applied between the source cathode arrangement and the heater cathode arrangement.

The focusing electrode of the heater cathode may have a potential of −6 kV, the same potential being applied to the heater cathode. When located in an electron gun, the heater cathode focusing electrode may be referred to as GM1 electrode. The heater cathode filament may have a potential of +8 V with respect to the heater cathode focusing electrode. The source cathode arrangement may have a potential of −5 kV.

An electron gun, or electron source, for generating an electron beam is provided. The electron gun comprises a cathode arrangement according to any of the aspects or embodiments described above for emitting a plurality of electrons; and at least one shaping electrode for shaping, or focusing, the emitted electrons into the electron beam.

The electron gun may comprise one or more shaping electrodes. For example, it may comprise three shaping electrodes. The shaping electrodes may each comprise a conducting body provided with an aperture, also referred to as shaping aperture. The shaping apertures are coaxially aligned.

Preferably, the shaping apertures are coaxially aligned with the transmission aperture of the focusing electrode.

Some embodiments of the invention relate to an electron beam lithography system for exposing a target using at least one electron beamlet, the system comprising: a beamlet generator for generating the at least one electron beamlet; a beamlet modulator for patterning the at least one electron beamlet to form at least one modulated beamlet; a beamlet projector for projecting the at least one modulated beamlet onto a surface of the target; wherein the beamlet generator comprises an electron gun according to any one of the embodiments described above.

BRIEF DESCRIPTION OF DRAWINGS

Various embodiments will be further explained with reference to embodiments shown in the drawings wherein:

FIG. 1b schematically shows a perspective view of a portion of a cross section of the cathode arrangement of FIG. 1a;

DESCRIPTION OF EMBODIMENTS

Figure 1A:
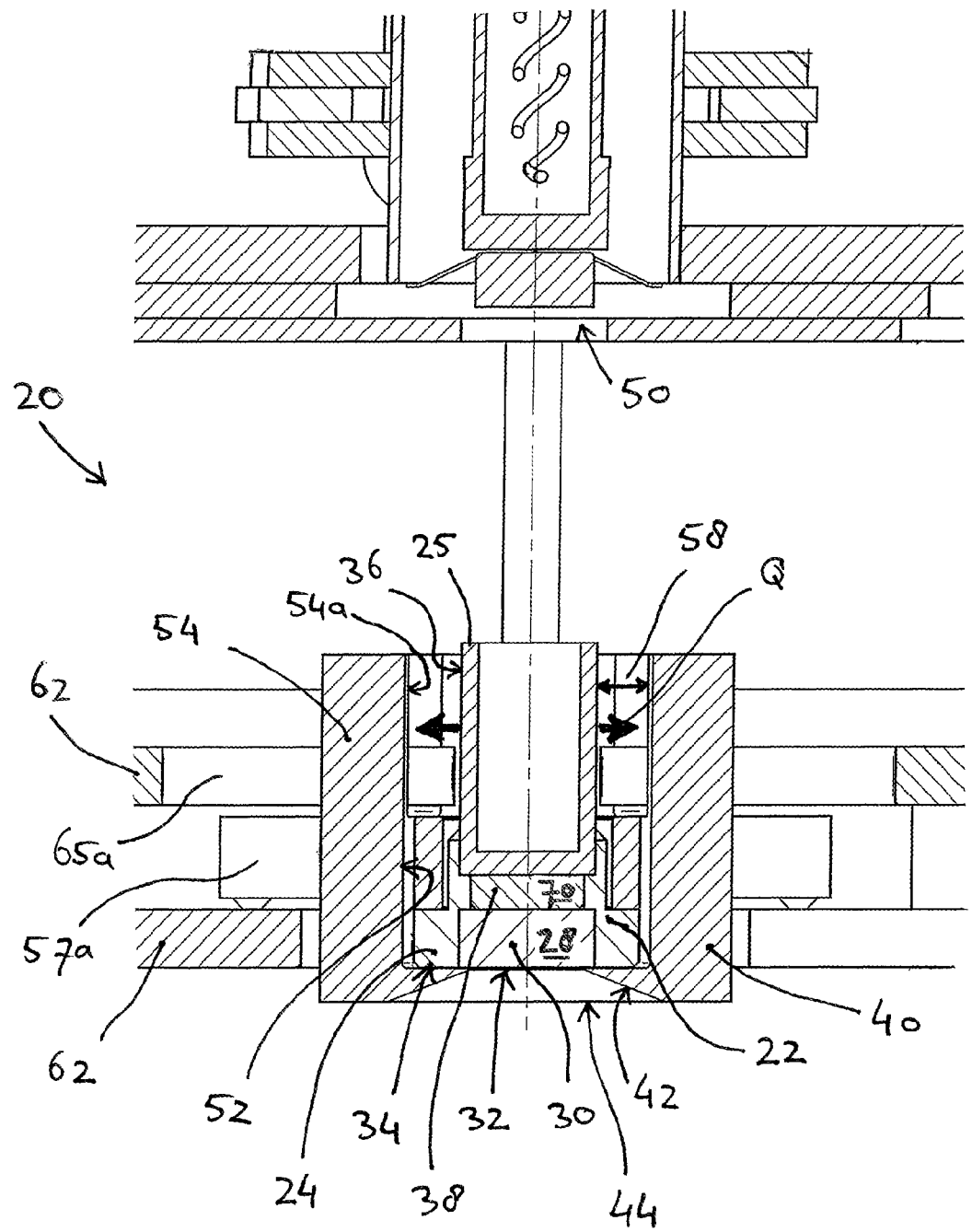
FIG. 1a schematically shows a cross-section of a cathode arrangement.

The figures and the following description are intended for examples and illustrations of various embodiments, and are not to be interpreted as limiting. Alternative embodiments may be possible, without departing from the scope of the appended claims.

"Longitudinal" refers to the direction indicated by the Z-axis in the figures, while "transversal" corresponds to any direction perpendicular to the Z-axis, i.e. any direction in the plane spanned by the X- and Y-axis. "Radial" refers to a transversal direction in the plane spanned by the X and Y axes, and pointing away from a central axis along the Z-direction. This convention is used in a non-limiting manner, and merely serves to clarify spatial relations in exemplary embodiments described below.

The cathode arrangement 20 is configured to emit a plurality of electrons, for forming an electron beam. The cathode arrangement 20 comprises a thermionic cathode, preferably of the dispenser type, and a focusing (pierce) electrode 40. The thermionic cathode shown in FIG. 1a comprises a cathode body or housing 22, housing an emission portion 30 provided with an emission surface 32, and a reservoir 38 for holding a material which, when heated, releases work function lowering particles 70. The emission portion may comprise a porous pellet body 28, for example a Tungsten pellet, sealed to the inner surface of the cathode body 22 such that the reservoir 38 provides a sealed space within the cathode. The pellet body 28 may be of cylindrical shape, arranged with a first end surface forming the emission surface 32 and the second end surface facing the reservoir 38. The emission portion 30 is provided at a first end 24 of the cathode body 22. The cathode body 22 is a hollow body having an outer surface 36 circumscribing the emission portion 30 and the reservoir 38. Preferably, at the first end 24, the cathode body 22 has a sufficient thickness to form a surface or rim 34 facing the focusing electrode 40. The surface 34 is preferably perfectly aligned with the emission surface 32. This rim 34 is hereafter referred to as non-emission surface 34. Preferably, the non-emission surface 34 and the emission surface 32 are joined together, for example by means of brazing, to form a single cathode surface.

The reservoir 38 may be cup-shaped with an open end facing the emission portion 30, and may be filled with material comprising work function lowering particles 70 which upon heating diffuse from the reservoir 38, through the porous pellet body 28, to the emission surface 32. Preferably, the particles form a work function lowering layer at the emission surface 32. Such work function lowering layer reduces the minimum energy required for electron emission from the cathode emission surface 32, and may further improve the homogeneity of electron emission. The work function lowering particles emanates from the emission surface 32 at a first evaporation rate Φc during use of the cathode. These particles are replaced by particles 70 that reach the emission surface 32 later. Preferably, the dispenser type thermionic cathode allows for continuous replacement of work function lowering particles at the emission surface 32.

The focusing electrode 40 is made of an electrically conducting material. The focusing electrode 40 comprises a planar body, e.g. a plate, provided with an electron transmission aperture 44 for transmitting electrons emitted at the emission surface 32. The electron transmission aperture 44 is preferably circular, to allow circularly symmetric electron beam generation.

Figure 1B:
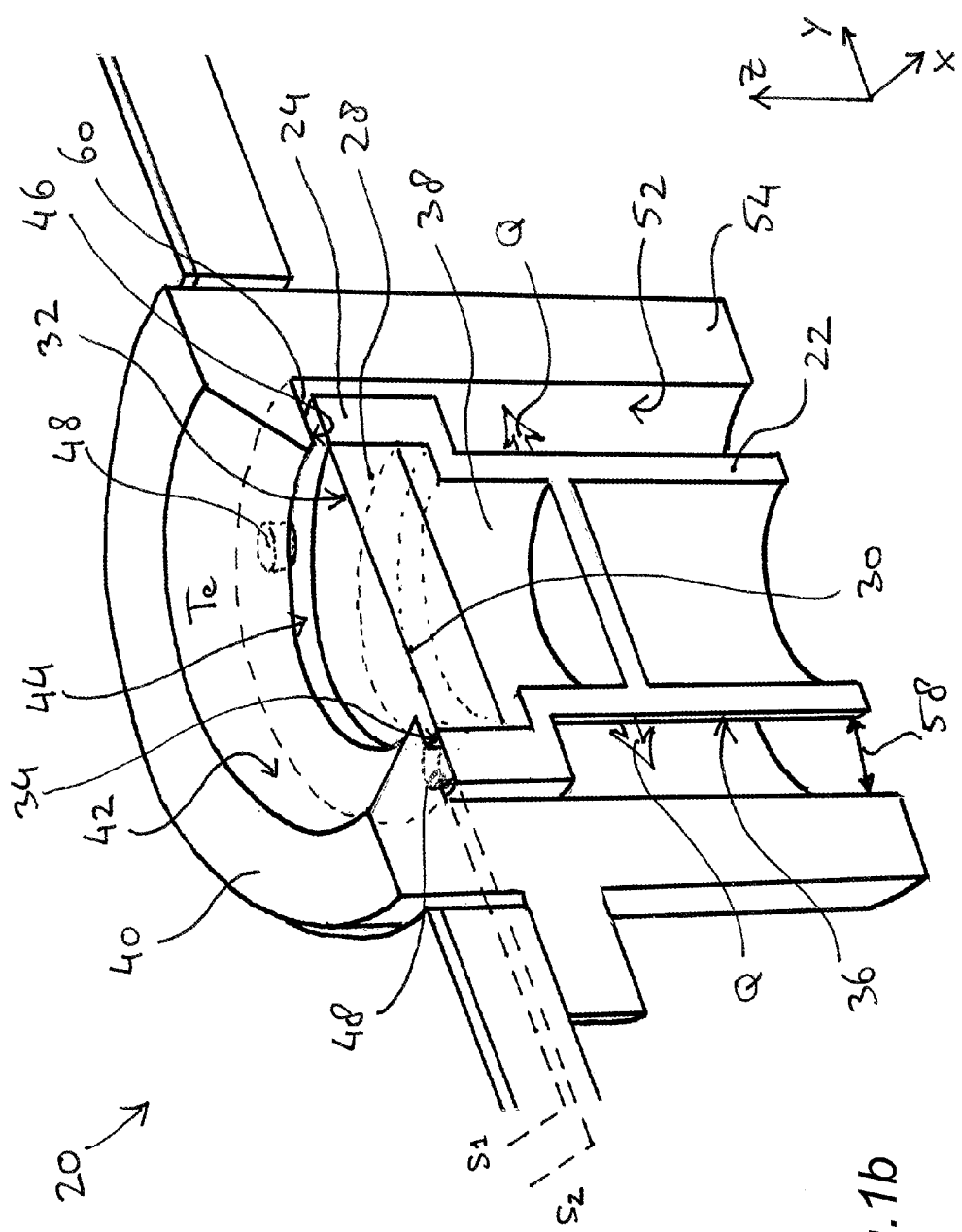

The focusing electrode 40 comprises a focusing surface 42 for focusing electrons emitted at the emission surface 32 of the cathode. The focusing surface 42 has a shape that enables it to generate an electric field distribution suitable for repelling electrons emanating from the emission surface 32 in a desirable direction away from the emission surface 32. In FIGS. 1a, 1b, the focusing surface 42 of the focusing electrode 40 is defined by the outwardly slanted surface of the truncated conical cut-out, and this focusing surface 42 surrounds the transmission aperture 44.

At least a portion of the focusing electrode 40 of the cathode arrangement 20 is provided near the emission surface 32. The term "near" in this context corresponds to a distance D of about 1-15 μm between a plane S2 defined by emission surface 32 and a transmission aperture plane S1. Preferably, a longitudinal interspacing 60 of about 5 μm, possibly even smaller, is formed between the inner electrode surface 46 and the cathode surface. The transmission aperture plane S1 is spanned by the edge of the focusing surface 42 facing the electron transmission aperture 44. Thus, the transmission aperture plane S1 in FIGS. 1a, 1b is located in the plane at which the electron transmission aperture has the smallest diameter, i.e. is located closest to the emission surface 32. Preferably, the transmission aperture plane S1 is aligned parallel to the emission surface 32, to provide a substantially isotropic focusing effect on the electrons emitted by the emission surface 32.

Figure 3:
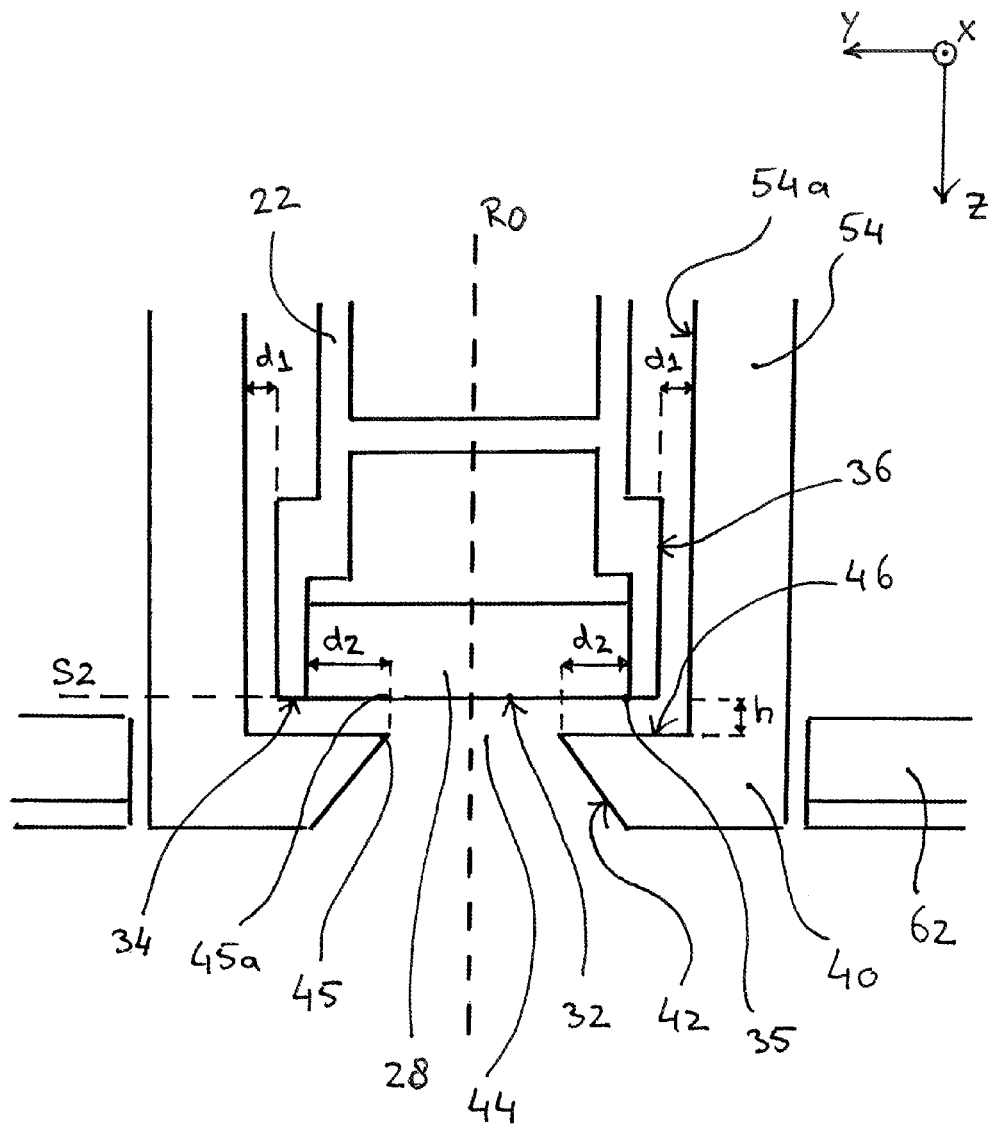
FIG. 3 schematically shows a cross-sectional view of a cathode arrangement.

In an embodiment, the aperture perimeter 45 may span a smaller cross section than the emission surface 32, such that the inner electrode surface 46 extends with an overlap over the emission surface 32, analogous to the cathode arrangement described with respect to FIG. 3. Thereby a projection of a transmission aperture perimeter may always be fully located within a perimeter of the emission surface 32.

The lifetime of a thermionic cathode arrangement may be extended by keeping the focusing surface 42 of the focusing electrode at a temperature Te above a threshold temperature Te− at which a rate of release, or evaporation, of work function lowering particles from the focusing surface 42 equals or exceeds the rate Φc at which work function lowering particles emanating from the emission surface 32 arrives at the focusing surface 42. Keeping the focusing surface 42 above such threshold temperature Te− prevents the development of a layer formed by deposition of work function lowering particles onto the focusing surface 42. Deposition of such particles negatively influences the performance of the cathode arrangement 20. In other words, a sufficiently high temperature of the focusing surface 42 reduces, and mostly even prevents, accumulation of work function lowering particles on the focusing surface 42.

Various methods of generating the heat in the cathode body 22 and the emission portion 30 of the cathode may be employed. Preferably, these methods cause heating of the cathode body 22 and/or emission portion 30, but do not directly heat the focusing electrode 40.

To accomplish bringing the focusing surface 42 at a sufficiently high temperature, the cathode arrangement 20 comprises an adjustable heat source for heating the cathode in such a way that the focusing electrode 40 is heated as well. Preferably, the focusing electrode 40 is heated by thermal radiation Q, e.g. infrared radiation, emitted by the cathode body 22. The cathode body 22 and the focusing electrode 40 may be arranged and configured such that the heat transfer from the cathode body 22, and possibly also the emission surface 32, results in a focusing surface temperature within the range specified above.

The geometry and relative arrangement of the cathode body and the focusing electrode, in combination with the adjustable heat source, are configured for controlling the temperature of the focusing surface 42 during cathode operation. By suitable adjustment of the adjustable heat source, an electrode temperature Te may be achieved such that it is above a threshold temperature Te− at which the rate of work function lowering particles emanating from the emission surface of the cathode is substantially equal to the rate at which such work function lowering particles evaporate from the focusing surface 42.

In the embodiment depicted in FIG. 1a, the adjustable heat source takes the form of an auxiliary cathode or heater cathode 50, arranged to heat the thermionic cathode. The heater cathode 50 preferably has an adjustable power supply for controlling a rate at which electrons are emitted, and is thus capable of regulating the thermal energy supplied to the thermionic cathode. The heater cathode 50 may for example be configured for generating an electron beam with a beam current of about 1 to 10 mA, wherein the emitted electrons may be accelerated toward the cathode body 22 over a 1 kilovolt electrical potential difference, resulting in a power of about 1 to 10 W. Such power suffices for bringing the source cathode to a temperature of approximately 1500 K.

The heater cathode 50 is arranged to emit electrons towards the a rear portion 25 of the cathode body 22, referred to as receptacle or Faraday cup 25. Preferably a portion of the kinetic energy of the electrons received by the receptacle 25 is converted into heat. The receptacle 25 is arranged for receiving electrons, either directly from the heater cathode 50 or indirectly in the form of backscattered electrons after impact of electrons on the surface adjacent to the end of the reservoir 38 facing away from the emission surface 32. The receptacle 25 has a depth such as to minimize escape of electrons. As a result of the impact of electrons, kinetic energy of the electrons is converted into heat, resulting in heating of the receptacle 25 and of the reservoir 38. Thus, upon receipt of electrons from the heater cathode 50 (or another adjustable heat source), the cathode body 22 will be heated. The heated cathode body 22 will lose some of its heat energy via thermal (e.g. infrared) radiation Q, which is, at least partially, radiated outward from the outer surface 36. The heat trapping surface 52 of the focusing electrode 40 surrounding the cathode body 22 will receive and absorb a major portion of the heat radiation Q emitted by the cathode body 22. Analogously, a heat trapping surface 52 may be arranged on the inner electrode surface 46 to receive thermal radiation from the non-emission surface 34. The heat trapping surface 52 is in good thermal communication with the focusing electrode surface 42. As a result, a substantial portion of the received heat energy will be conducted to the focusing surface 42.

Thus, the adjustable heat source supplies a controllable amount of thermal energy to the reservoir 38, and influences the amount of heat transferred, by thermal radiation, towards the focusing electrode 40. Consequently, the adjustable heat source indirectly controls the thermal energy supplied to the focusing electrode 40 in general, and the focusing surface 42 of the focusing electrode 40 in particular.

In alternative embodiments, the adjustable heat source may be formed by a heater element directly thermally connected to the focusing electrode 40. For example, an electrical filament arranged within the focus electrode could be used. Alternatively, a part of the electron beam emitted from the heater cathode could be diverted and directed toward the focus electrode to directly heat this.

Alternatively, or additionally, other heat sources may be used for heating the thermionic cathode. For example a controllable electrical heating filament may be provided in the cathode body 22, or in the receptacle 25. Also in this case, the focusing electrode 40 may be heated by thermal radiation from cathode body 22.

In some embodiments, the adjustable heat source may be used in addition to a standard heat source for heating a reservoir in a dispenser type thermionic cathode, such as an electrical filament.

In the embodiments depicted in FIGS. 1a, 1b, 2a, 2b, the focusing electrode 40 comprises a shell 54 surrounding the cathode body 22. Alternatively, the shell 54 may be partly enclosing the cathode body 22. The shell 54 is provided with an inner surface, and may take the form of a hollow cylinder. At least a portion of the inner surface forms a heat trapping surface 52 configured to absorb thermal radiation Q emitted by the cathode body 22. As for example depicted in FIG. 1a, the heat trapping surface 52 surrounds and faces inwards to the outer surface 36 of the cathode body 22. The inner electrode surface 46 may be configured to absorb thermal radiation emitted from the non-emission surface 34. The absorbed thermal radiation Q will heat the focusing electrode 40 and its focusing surface 42 in particular. As described above, the focusing surface 42 is in good thermal conduction with the heat trapping surface 52. The heat trapping surface 52 enables efficient reuse of thermal radiation Q emitted by the cathode body 22 by absorbing it for heating the focusing electrode 40 and its focusing surface 42 in particular.

Preferably, the shell 54 and cathode body 22 are coaxially aligned. A radial interspacing 58 is defined between the outer cathode surface 36 and the heat trapping surface 52. The radial interspacing 58 extends in a radial direction between the heat trapping surface 52 and the outer cathode surface 36, and extends from the first cathode end 24 along the longitudinal direction Z. The radial interspacing may be maintained by four radial spacers, or pads, 59 circumferentially distributed around the inner surface of the shell 54 facing the first cathode end 24, as illustrated in FIG. 2b.

Figure 2A:
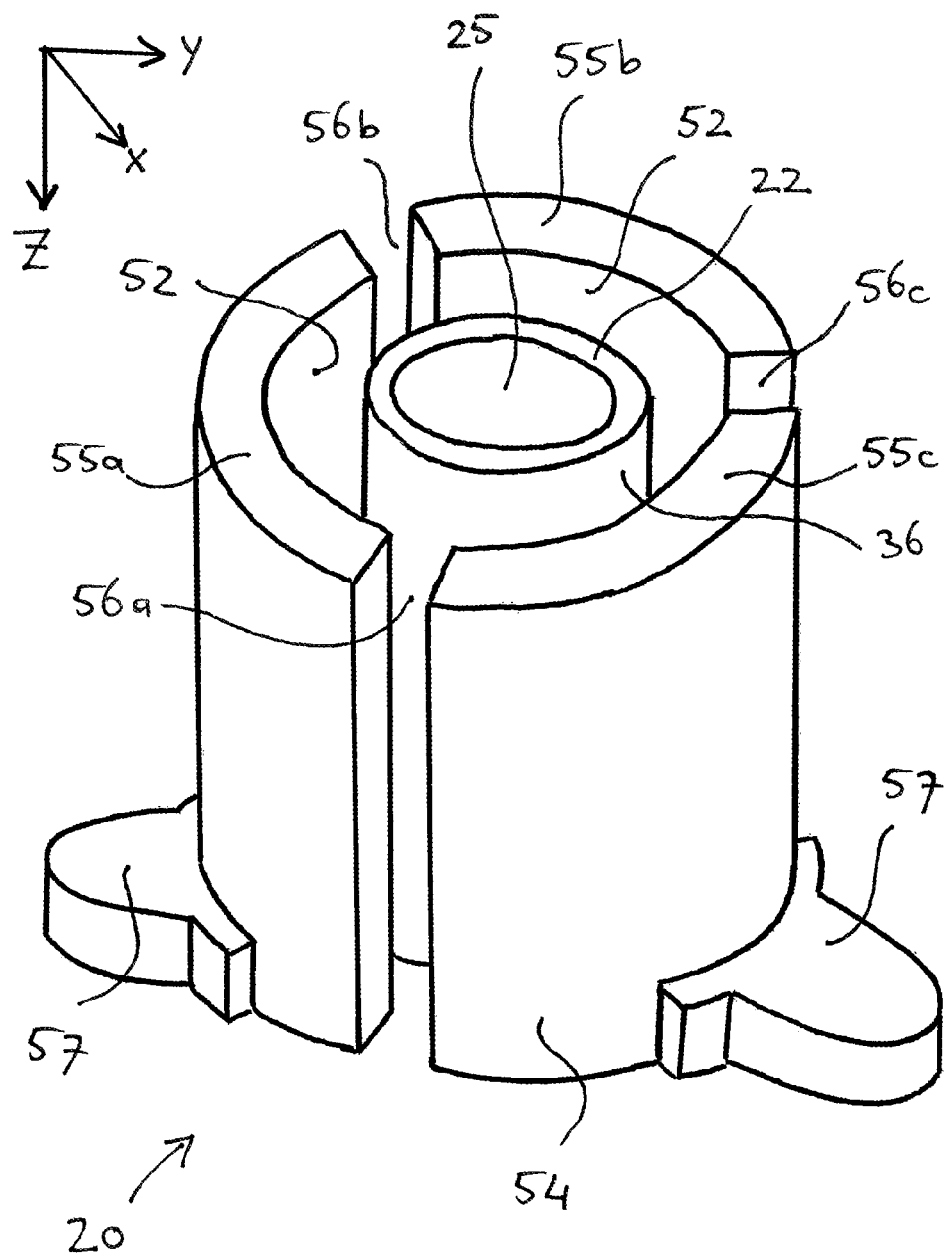
FIG. 2a schematically shows a perspective view of a cathode arrangement.
Figure 2B:
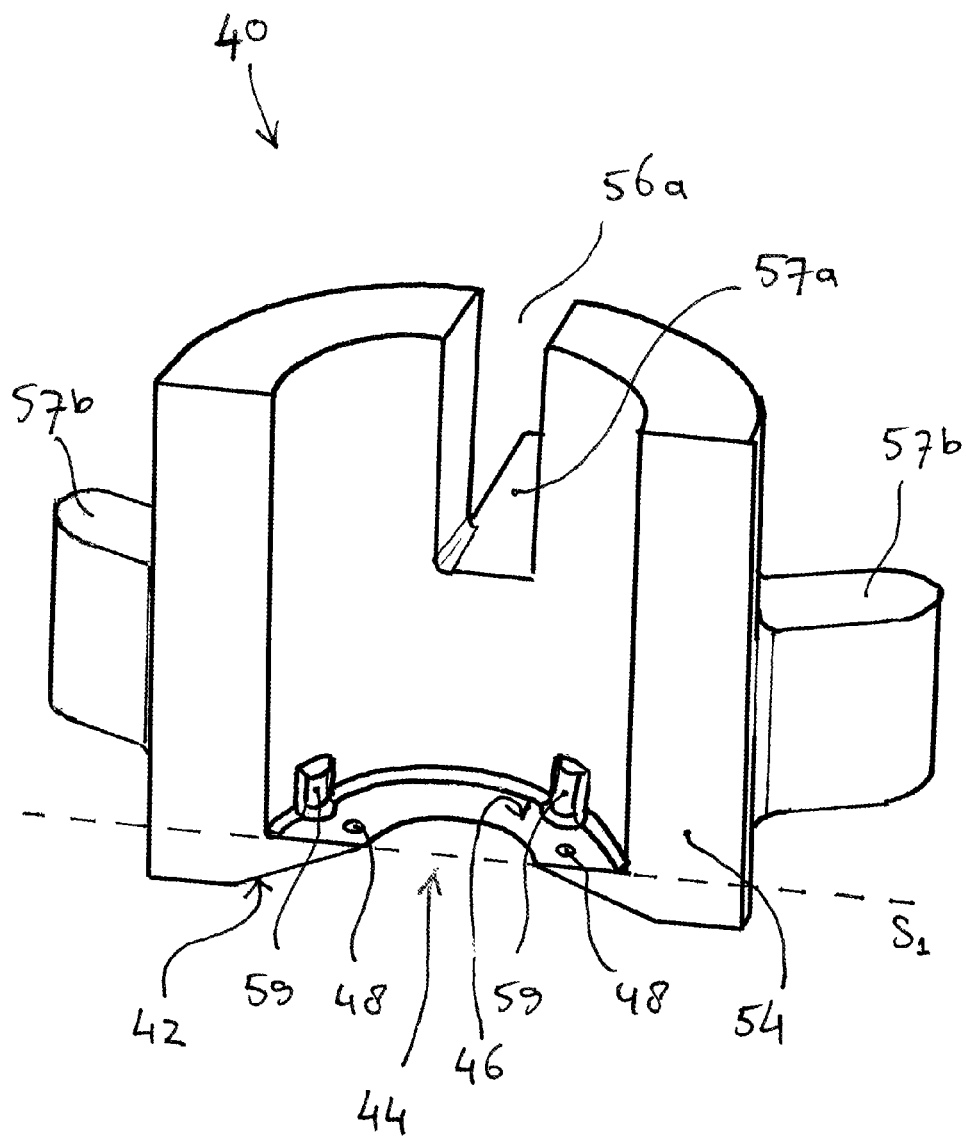
FIG. 2b schematically shows a perspective view of a portion of a focusing electrode for a cathode arrangement.

The inner electrode surface 46 is preferably provided with three spacing structures, or contact pads, 48, evenly distributed along a circumference of the transmission aperture 44, as illustrated in FIGS. 1b and 2b. The spacing structures 48 are positioned in contact with the non-emission surface 34. The three spacing structures 48 may have substantially a shape of a cylinder. Each spacing structure 48 preferably has a small transversal cross-section in comparison with a cross-section of the emission portion 30, so as to minimize thermal conduction between the focusing electrode 40 and the non-emission surface 34. They may be formed of the same or of a different material as the inner electrode surface. Extremities of three spacing structures 48 define three non-coinciding points that span a plane S2. The spacer structures 48 assist in maintaining an accurate parallel alignment of the transmission aperture plane S1 with the emission surface 32, while simultaneously defining a longitudinal interspacing 60 between the inner electrode surface 46 and the non-emission surface 34.

Preferably, a vacuum is achieved in the radial interspacing 58 between the cathode body 22 and the shell 54. Such vacuum provides thermal insulation that reduces (or even eliminates) thermal conduction between the cathode body 22 and the focusing electrode 40. By minimizing thermal conduction between the cathode body 22 and the focusing electrode 40, thermal radiation Q becomes the dominant heat transfer mechanism. High temperature gradients due to thermal conduction effects are thus avoided, yielding a more homogeneous temperature distribution within the focusing electrode 40. Furthermore, the focusing electrode may reach the equilibrium temperature faster.

As mentioned earlier, work function lowering particles emanating from the emission surface 32 of the cathode may at least partially precipitate onto the focusing electrode 40, in particular onto surfaces in close proximity of the emission surface, such as the focusing surface 42. However, if the focusing surface 42 is sufficiently heated, such deposited particles are released, or evaporate, from the surface 42. Such evaporation of work function lowering particles takes place at a rate $\Phi e$ depending on the electrode temperature Te.

Regulation of the power output by the heater cathode 50 thus provides control over the amount of thermal energy supplied to the focusing electrode 40. By suitable adjustment of the heater cathode 50 output, the amount of heating of the cathode body 22, and thereby the amount of heating of the focusing electrode 40 and its focusing surface 42 in particular, may be influenced in such a way that the electrode temperature Te of the focusing electrode 40 is suitably set and/or regulated. As explained above, the geometry of the focusing electrode, in particular the heat trapping surface area and the external surface area, influences the temperature of the focusing electrode. As explained earlier, by keeping the electrode temperature Te above a threshold temperature Te− during cathode operation, the evaporation rate $\Phi e$ of the work function lowering particles will be higher than the rate at which work function lowering particles arrive at the focusing surface.

Unfortunately, raising the temperature Te of the focusing electrode 40 too much may result in considerable emission of electrons by the focusing surface 42. Therefore, it is preferred to keep the temperature of the focusing electrode 40 below a further threshold temperature Te+. Experiments have shown that a suitable value for the threshold temperature Te+ corresponds to an electrode temperature Te at which electron emission from the focusing surface 42 is about 0.01% of the electron emission from the emission surface 32 of the cathode.

The work function lowering particles 70 that are used in embodiments of the invention comprise Barium (Ba). In this case, the adjustable heat source 50 may be configured for keeping the electrode temperature Te above a threshold temperature Te− equal to about 900K, and below a further threshold temperature Te+ equal to about 1300K. In such case, the temperature Te of the focusing surface 42 may be kept at a temperature between 900K to 1300K, with allowed temperature fluctuations of ±50 K. In the higher temperature range, e.g. for focusing surface temperatures of 1200K to 1300K, the focusing surface should preferably have been exposed to a treatment, such as coating or carbonation, in order to further increase the work function thereof.

As explained before, an electrode temperature Te of the focusing electrode 40 above 900 K assures that the evaporation rate of Ba-containing particles from the focusing electrode 40 is higher than the rate at which such Ba-containing particles emanate from the cathode emission surface 32, or at least higher than the rate at which such particles reach the focusing surface 42. Hence, accumulation of Barium depositions on the focusing surface 42 is reduced, and most often avoided. Keeping the electrode temperature Te below 1300K, in combination with an increased work function, assures that the current density of electrons emitted by the focusing electrode 40 is below 0.01-0.1% of the current density of electrons emitted by the cathode emission surface 32.

Adjustment control of the heat source may be implemented via computer code i.e. a computer program product that provide instructions for carrying out the method to a processing device (e.g. a computer arrangement) when run on such a device. The computer program product may be stored on a computer readable medium.

FIG. 2a schematically shows a perspective view of a rear portion of an embodiment of a cathode arrangement 20. FIG. 2a shows a focusing electrode 40 comprising a cylindrical shell 54 having a finite radial thickness along the angular (i.e. azimuthal) direction, and surrounding an inner void, or cavity, for accommodating a cathode body 22. The cathode body 22 may be a cathode body as illustrated in FIGS. 1a and 1b. The shell 54 is provided with angular interspacings 56a, 56b, 56c that subdivide the shell 54 into three shell portions 55a, 55b, 55c, which are symmetrically placed about a common axis, also referred to as longitudinal axis. The focusing electrode 40 has a front cover provided with a circular electron transmission aperture 44 surrounded by a focusing surface 42 (not shown in FIG. 2a). Inner surface regions of the cylindrical shell portions 55a-55c jointly define a heat trapping surface 52. The angular interspacings 56a-56c depicted in FIG. 2a are defined by cutouts, for example linear or helical cut-outs, that extend along the angular direction as well as the longitudinal direction Z. The interspacings 56a-56c may be used for accommodating a confining arrangement for confining the focusing electrode 40 and/or the cathode body 22 to a support structure, as explained with reference to FIGS. 4 and 5.

Figure 4:
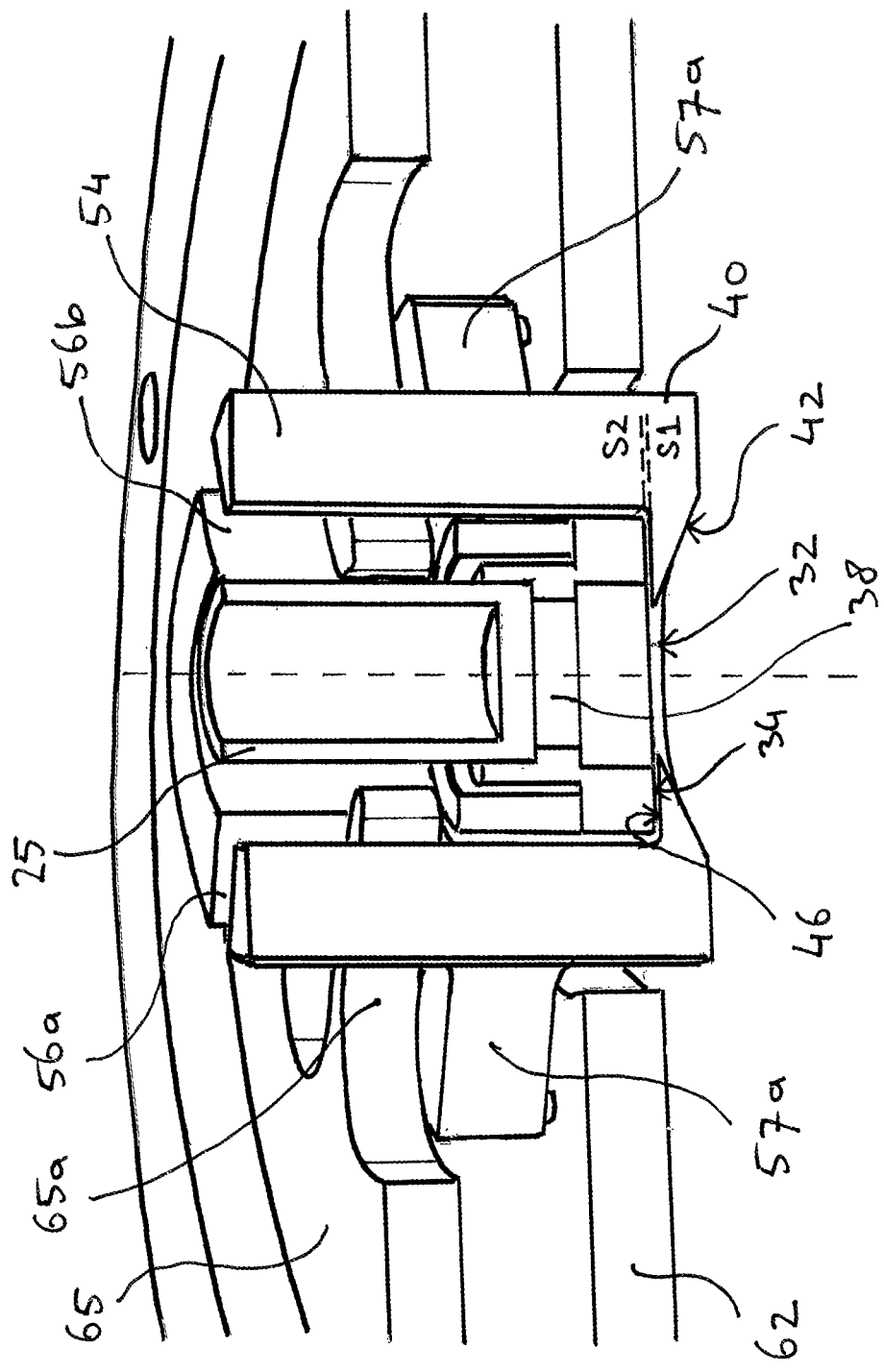
FIG. 4 schematically shows a cross sectional perspective view of a cathode arrangement mounted in a support structure, especially in an electron gun.

The shell 54 may be provided with focusing electrode support elements 57a for supporting the focusing electrode in the longitudinal direction. The support elements 57a may be provided with protrusions, or contact pads, forming contacts with a support element 62, as illustrated in FIG. 4. The contact pads may have a diameter of 150 μm and a height of 100 μm. Also three transversal support elements 57b may be provided, indicated as substantially cylinder shaped structures extending from the focusing electrode 40. These confine rotation of the focusing electrode about the longitudinal axis. The support elements 57 may be formed integrally with the cylindrical shell 54, or may be attached thereto. A cathode arrangement, comprising a cylindrical shell 54 as described herein, mounted in a support structure 62 comprising a confining arrangement 65 having end stop structures 65a is illustrated in FIG. 4.

FIG. 2b schematically shows a perspective view of a cross section of a focusing electrode 40 comprising a cylindrical shell 54 provided with angular intersections 56a-c, focusing electrode support elements 57a,b, spacing structures 48 and radial spacers 59.

In electron beam lithography, it is desirable to work with electron beams that are highly homogeneous in transversal directions, so that aberration effects in electron beam manipulation can be minimized.

FIG. 3 shows a longitudinal cross-section of an embodiment of a cathode arrangement 20, wherein the emission surface 32 of the cathode and the transmission aperture 44 of the focusing electrode 40 are properly aligned, in order to improve the homogeneity of the generated electron beam. The cathode body 22 has an emission surface 32 for emitting electrons in a longitudinal direction Z. The emission surface 32 is bounded by an emission perimeter 35. The focusing electrode 40 (at least partially) encloses the cathode body 22 in transversal directions X, Y. The focusing electrode 40 comprises an electron transmission aperture 44 near the emission surface 32 for focusing the electrons emitted by the emission surface 32 during operation. The transmission aperture 44 is bounded by an aperture perimeter 45. The cathode body 22 is moveably arranged within the focusing electrode 40 over a maximum transversal distance d1 from an aligned position R0. The aperture perimeter 45 transversally extends over the emission surface 32 and beyond the emission perimeter 35 with an overlap distance d2 that exceeds the maximum transversal distance d1. In other words, the focusing electrode overlaps part of the emission surface, by extending beyond the emission perimeter by the overlap distance d2. As can be understood from FIG. 3, the emission perimeter 35 defines a larger area than the aperture perimeter 45. Preferably, both the aperture perimeter 45 and the emission perimeter 35 are circular, whereby the diameter of the aperture diameter 45 is smaller than the emission perimeter 35.

The overlap distance d2 exceeding the maximum transversal distance d1 implies that in the aligned position R0, the aperture perimeter 45 everywhere protrudes inward over more than the transversal distance d1 beyond the emission perimeter 35. In the aligned position R0, the cathode body 22 and transmission aperture 44 are optimally aligned for electron emission from the emission surface 32 and for electron transmission through the transmission aperture 44. Any transversal deviation from the aligned position R0 will reveal a new portion of the emission surface 32. The requirement d2>d1 assures that any transversal misalignment will reveal only a different portion of the emission surface 32. Hence, the density of electrons released by the emission surface 32 and transmitted through the aperture 44 remains relatively homogeneous, resulting in a relatively homogeneous electron beam 4.

The cathode body 22 has a surface 36 facing an inner surface 54a of the shell 54. The maximal transversal distance d1 is defined in FIG. 3 as a distance between the inner surface 54a and the surface 36. A projection 45a of the aperture perimeter 45 onto the emission plane S2 defined by the emission surface lies entirely within the emission perimeter 35, even in the case of improper alignment.

The focusing electrode 40 has an inner surface 46 that faces the emission surface 32, and is positioned at a longitudinal distance h from the emission surface 32. This longitudinal distance h may be provided as a longitudinal interspacing 60, for example by spacing structures 48, as described for the cathode arrangement illustrated in FIGS. 1a, 1b and 2b.

The overlap distance d2 preferably is in a range of 10 micrometers to 100 micrometers, depending on the maximum transversal distance d1. The maximum transversal distance d1 may be in a range of 10-35 µm. Thereby, mechanical tolerances for the alignment of the cathode body 22 with respect to the focus electrode 40 can be relaxed.

The aperture perimeter 45 and the emission perimeter 35 are preferably similarly shaped (or "homomorphic"). In the embodiment shown in FIG. 1b, the emission perimeter 35 and the aperture perimeter 45 are both circular, which results in a highly symmetric cathode arrangement 20, for which any transversal misalignment between the emission surface 32 and the transmission aperture 44 is only dependent on a radial relative displacement away from the aligned position R0.

The focusing electrode 40 of the cathode arrangement illustrated in FIG. 3 may comprise a cylindrical shell 54, described with reference to FIGS. 2a and 2b.

The cathode arrangement illustrated in FIG. 3 may be configured for heating the focus electrode 40 in an analogous manner as described with reference to FIGS. 1a and 1b.

Figure 5:
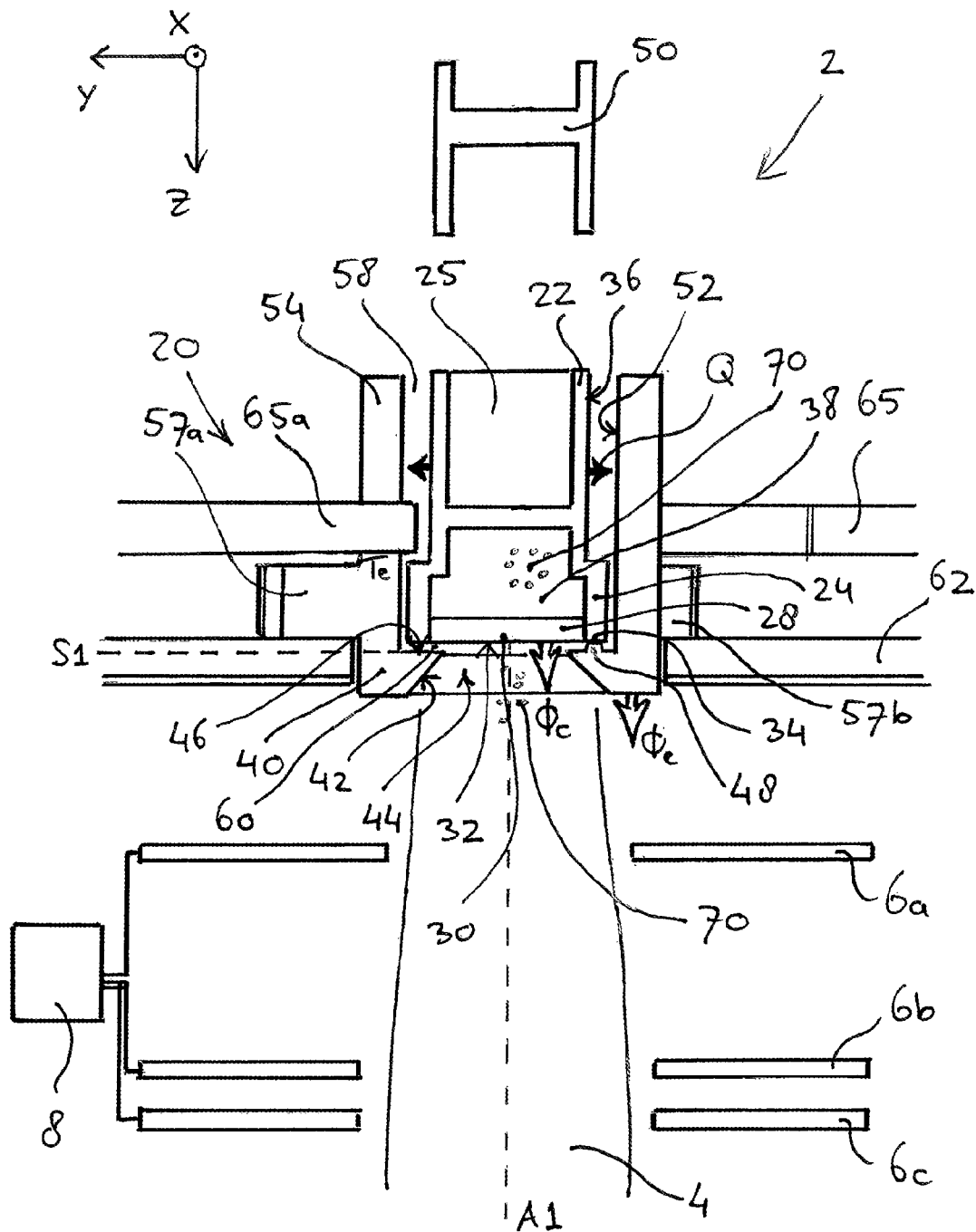
FIG. 5 schematically shows a cross-sectional view of part of an electron gun.
Figure 6:
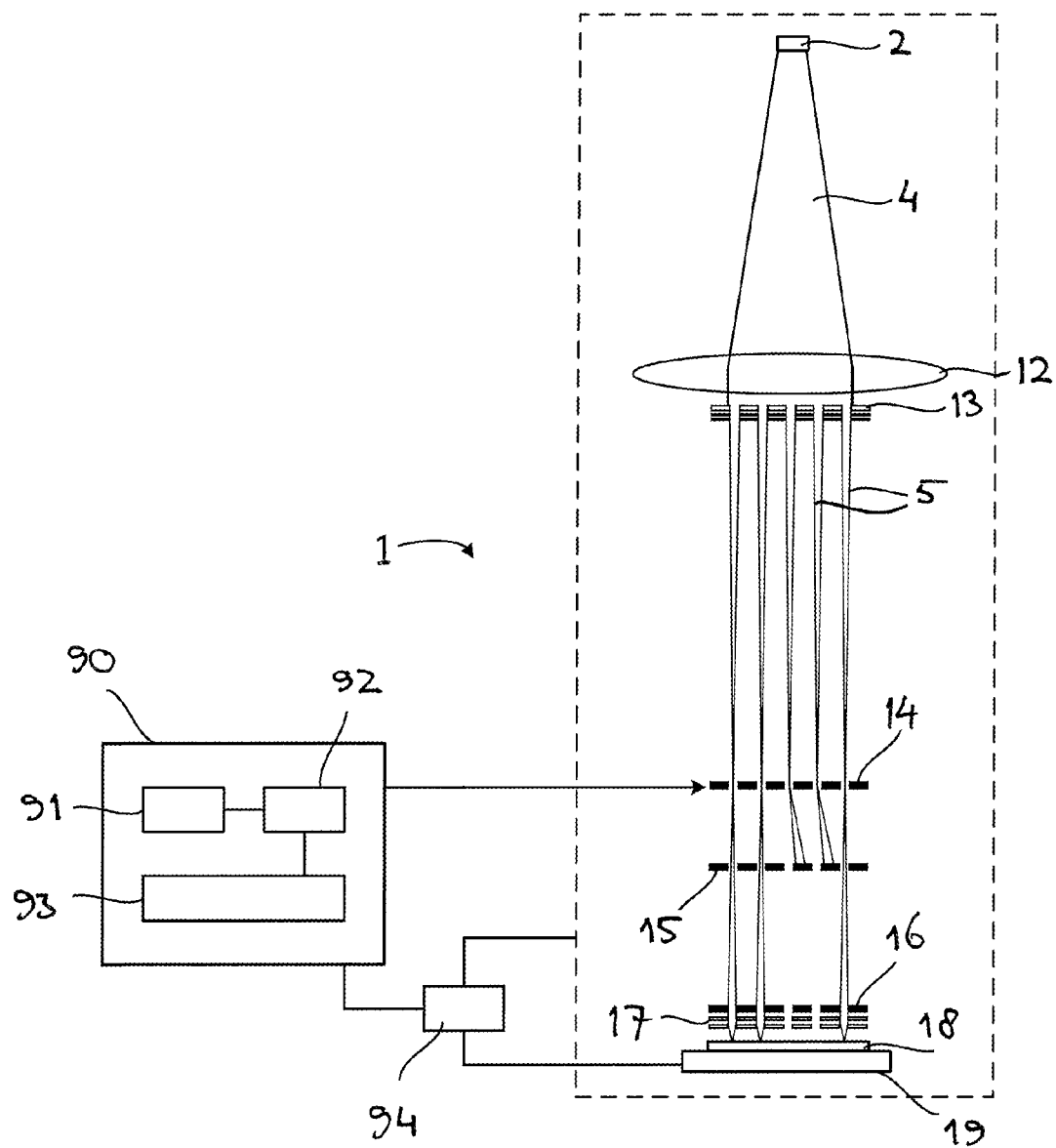
FIG. 6 schematically shows an electron beam lithography system.

FIG. 4 schematically illustrates a cathode arrangement 20 mounted on a support structure 62, such as a support electrode of an electron gun. The cathode arrangement 20 may be a cathode arrangement according to any of the embodiments described above. The cathode arrangement 20 and support structure 62 are illustrated in the orientation in which they are intended to be positioned during use, for example in electron beam lithography. The support structure 62 may comprise a support, or G0, electrode of an electron gun 2, for example as illustrated in FIG. 5 or 6. The support electrode 62 is usually kept at the same potential as the focusing electrode 40, and may form part of the electron optics of the electron gun. Also the confining arrangement 65 may be maintained at this potential.

The cathode body 22 rests, by means of gravity, on the inner electrode surface 46, preferably on the three spacing structures 48 discussed above. The three spacing structures 48 align the emission plane S2 with the aperture plane S1, and provide a spacing 60 between the emission portion and the inner electrode surface 46.

The focusing electrode 40 rests on the support structure 62 via three longitudinal support elements 57a, also by means of gravity. As illustrated in FIG. 4, the support elements 57a may form point contacts with the support structure 62. By forming three point contacts between the support elements 57a and the support structure 62 the focus electrode 40, in particular the aperture plane S1, may be aligned parallel with a plane of the support electrode. Via the point contacts, heat conduction between the focusing electrode 40 and the support structure 62 is minimized.

A confining arrangement 65 is provided for confining the cathode body 22 with respect to the focusing electrode 40 and the focusing electrode 40 with respect to the support structure 62. The confining arrangement 65 may comprise confining structures, or end stops, 65a protruding through each angular interspacing 56a-56c of the shell structure 54, in order to confine movement of the cathode body 22 with respect to the focusing electrode 40. In particular, the end stops 65a may block relative movement during mounting, demounting, storage and/or transport of an electron gun 2 comprising the cathode arrangement. A gap is formed between a surface 24a of the first end 24 of the cathode body 22 and a surface of the end stop 65a facing the surface 24a, and between the perimeter of the angular interspacings 56a-56c and a surface of the end stop surface 65a facing the interspacing perimeter.

Further, the confining arrangement may comprise blocking structures for confining rotation around the longitudinal axis and/or transversal movement of the focusing electrode 40 via the transversal support elements 57b.

The distances between the end stops 65a and the corresponding surfaces of the cathode arrangement 20 allow for thermal expansion of the different structural features without the end stops 65a causing mechanical tensions and/or deformation of the cathode arrangement, which might in turn cause degradation of the electron beam generated by the electron gun. Thereby, deformation or other damage of structures due to (differences in) thermal expansion may be avoided. Also, thermal conduction between the cathode arrangement 20 and the support structure 62 may be avoided.

FIG. 5 schematically shows a cross-sectional view of an electron gun 2 comprising a cathode arrangement 20 as illustrated in FIGS. 1a and 1b. Alternatively, it may comprise a cathode arrangement 20 as illustrated in FIG. 3, or any other embodiment of a cathode arrangement described herein. A heater cathode 50, arranged to heat the receptacle 25 and the reservoir 38, is illustrated. However, alternatively other heat sources may be used, as discussed above. As is illustrated in FIG. 5, the heater cathode 50 is coaxially aligned with the thermionic cathode, especially with the transmission aperture 44. Electrons emitted from the heater cathode are formed into an electron beam entering the receptacle 25 in order to heat the cathode body 22 and the reservoir 38, as described above. A heater cathode focusing electrode may be provided to focus electrons into the receptacle 25. The heater cathode focusing electrode may be similar in shape to the electrodes 6a-6c described below, and is preferably coaxially aligned with these and with the transmission aperture 44. A potential difference, typically about 1 kV, is applied between the heater cathode and the cathode arrangement 20, such that electrons are accelerated from the heater cathode to the thermionic cathode. For example, the heater cathode arrangement, especially the focusing electrode thereof, may be applied a potential of −6 kV, and the cathode arrangement 20, including the focusing electrode 40 and the support electrode 62, may have a potential of −5 kV.

The electron gun 2 further comprises electrodes 6a-6c, also referred to shaping electrodes herein, arranged coaxial with the transmission aperture 44 and in a serial order for forming an electron beam 4 of the electrons emitted from the cathode. Generally, a divergent electron beam 4 is formed, directed along the longitudinal axis. In terminology of electron guns, the electrodes 6a-6c may also be referred to as G1-G3 electrodes. By applying different electrical potentials to the individual electrodes 6a-6c an electric field is created to guide the electrons in a direction away from the emission surface 32 of the cathode arrangement 20 such that a desired beam shape is obtained. For example, electrical potentials amounting to +3 kV, −4.2 kV and +2.5 kV may be applied to electrodes 6a, 6b and 6c, respectively. In FIG. 5 three electrodes 6a-6c are illustrated, although it should be understood that a different number of electrodes 6a-6c might be used.

The shaping electrodes 6a-6c may be communicatively connected to a power supply unit 8, also referred to as shaping controller. The power supply unit 8 may control the voltage applied to the electrodes 6a-6c in a dynamic way, for example to compensate for varying environmental circumstances and/or to obtain different shapes of the electron beam 4 that. The heater cathode 50, including its filament and focusing electrode, may also be connected to the power supply unit 8.

The shaping electrodes 6a-6c each comprise a conducting body provided with a shaping aperture 10a-10c, which are preferably perfectly circular and coaxially aligned with high accuracy.

The cathode arrangement 20 is mounted to a support structure 62, comprising a support electrode, also referred to as G0 electrode. The support electrode may be of similar shape as the first shaping electrode 6a, and connected to a the power supply 8. The support structure 62 may preferably be a support structure as illustrated in FIG. 4, comprising a confining arrangement 65 having end stops 65a.

The electron gun 2 described above may be part of a charged particle beamlet lithography system, for example a lithography system discussed with reference to FIG. 6, and in particular of a charged particle multi-beamlet lithography system 1 for transferring a pattern onto the surface of a target 18 using a plurality of charged particle beamlets 5.

FIG. 6 shows a simplified schematic drawing of an embodiment of a charged particle lithography system 1. Lithography systems are described for example in U.S. Pat. Nos. 6,897,458 and 6,958,804 and 7,019,908 and 7,084,414 and 7,129,502, U.S. patent application publication no. 2007/0064213, and co-pending U.S. patent application Ser. Nos. 61/031,573 and 61/031,594 and 61/045,243 and 61/055,839 and 61/058,596 and 61/101,682, which are all assigned to the owner of the present invention, and are all hereby incorporated by reference in their entirety.

In the embodiment shown in FIG. 6, the lithography system 1 comprises a beamlet generator 2, 12, 13 for generating a plurality of beamlets 5, a beamlet modulator 14, 15 for patterning the beamlets 5 to form modulated beamlets, and a beamlet projector 16, 17 for projecting the modulated beamlets onto a surface of a target 18. The beamlet generator 2, 12, 13 comprises an electron gun 2 for producing an electron beam 4. In FIG. 6, the electron gun 2 produces a substantially homogeneous, expanding electron beam 4. The beamlet generator 2, 12, 13 further comprises a collimator electrode assembly 12 for collimating the electron beam 4 and an aperture array 13 for forming a plurality of beamlets 5. The aperture array 13 blocks a desired part of the electron beam 4, whereas another portion of the electron beam 4 passes the aperture array 13 so as to produce the plurality of electron beamlets 5. The system generates a large number of beamlets 5, preferably about 10,000 to 1,000,000 beamlets.

The beamlet modulator 14, 15 comprises a beamlet blanker array 14 and a beamlet stopper array 15. The beamlet blanker array 14 comprises a plurality of blankers for deflecting one or more of the electron beamlets 5. The deflected and undeflected electron beamlets 5 arrive at beamlet stopper array 15, which has a plurality of apertures. The beamlet blanker array 14 and beamlet stopper array 15 operate together to block or let pass selected beamlets 5. Generally, if beamlet blanker array 14 deflects a beamlet 5, it will not pass through the corresponding aperture in beamlet stopper array 15, but will be blocked. However, if beamlet blanker array 14 does not deflect a beamlet 5, then it will pass through the corresponding aperture in the beamlet stopper array 15. Alternatively, beamlets 5 may pass the beamlet stopper array 15 upon deflection by corresponding blankers in the beamlet blanker array 14, and be blocked by the beamlet stopper array 15 if they are not deflected. The beamlet modulator 14, 15 is arranged to provide a pattern to the beamlets 5 on the basis of pattern data input provided by a control unit 90. The control unit 90 comprises a data storage unit 91, a read out unit 92 and a data conversion unit 93, and may be located remotely from the rest of the system 1, for example outside a clean room wherein the system 1 is positioned.

The modulated beamlets are projected onto a target surface of a target 18 by the beamlet projector 16, 17. The beamlet projector 16, 17 comprises a beamlet deflector array 16 for scanning the modulated beamlets over the target surface, and a projection lens arrangement 17 comprising one or more arrays of projection lenses for focusing the modulated beamlets onto the surface of the target 18. The target 18 is generally positioned on a moveable stage 19, whose movement may be controlled by a control unit such as control unit 90.

For lithography applications, the target 18 usually comprises a wafer provided with a charged-particle sensitive layer or resist layer. Portions of the resist film will be chemically modified as a result of irradiation by the electron beamlets. As a result thereof, the irradiated portion of the film will be more or less soluble in a developer, resulting in a resist pattern on a wafer. The resist pattern on the wafer can subsequently be transferred to an underlying layer, i.e. by implantation, etching and/or deposition steps as known in the art of semiconductor manufacturing. Evidently, if the irradiation is not uniform, the resist may not be developed in a uniform manner, leading to defects in the pattern. High-quality projection is therefore relevant to obtain a lithography system that provides a reproducible result.

The deflector array 16 may take the form of a scanning deflector array arranged to deflect each beamlet that passes through the beamlet stopper array 15. The deflector array 16 may comprise a plurality of electrostatic deflectors enabling the application of relatively small driving voltages. Although the deflector array 16 is drawn upstream of the projection lens arrangement 17, the deflector array 16 may also be positioned between the projection lens arrangement 17 and the surface of the target 18.

The projection lens arrangement 17 may be arranged to focus the beamlets 5 before or after deflection by the deflector array 16. Preferably, the focusing results a geometric spot size of about 10 to 30 nanometers in diameter. In such preferred embodiment, the projection lens arrangement 17 is preferably arranged to provide a demagnification of about 100 to 500 times, most preferably as large as possible, e.g. in the range 300 to 500 times.

Any embodiments of methods described above can be implemented via computer code i.e. a computer program product that provides instructions to a processing device (e.g. the control unit 90, which may comprise a computer arrangement) for carrying out the method when run on such a device. The computer program product may be stored on a computer readable medium.

The teachings herein with reference to cathodes and electron guns are not necessarily limited to the generation and emission of electrons as charged particles. The teachings may equally well be applied to the generation of other types of charged particles, such as ions, having either positive or negative electrical. Also, it must be understood that a similar system as depicted in FIG. 6 may be used with a different type of radiation, for example by using an ion source for producing an ion beam.

The invention claimed is:

1. Cathode arrangement comprising:
   a cathode body housing an emission surface for emitting electrons in a longitudinal direction, wherein the emission surface is bounded by an emission perimeter;
   a focusing electrode at least partially enclosing the cathode body in a transversal direction and comprising an electron transmission aperture for focusing the electrons emitted by the emission surface, wherein the aperture is bounded by an aperture perimeter, wherein the cathode body is moveably arranged within the focusing electrode over a maximum transversal distance from an aligned position, and wherein the aperture perimeter transversally extends over the emission surface and beyond the emission perimeter over an overlap distance that exceeds the maximum transversal distance.

2. Arrangement according to claim 1, wherein the overlap distance is in a range of 10 micrometers to 100 micrometers.

3. Arrangement according to claim 1, wherein the aperture perimeter and the emission perimeter are similarly shaped.

4. Arrangement according to claim 1, wherein the focusing electrode has an inner electrode surface facing the emission surface, and wherein three spacing elements are arranged for providing a spacing between the focusing electrode and the emission portion.

5. Arrangement according to claim 1, further comprising a support structure provided with a confining arrangement for confining the focusing electrode and/or the cathode body with respect to the support structure.

6. Arrangement according to claim 5, wherein the confining arrangement comprises end stops each facing a surface area of the cathode arrangement.

7. Arrangement according to claim 1, wherein the cathode body houses a thermionic cathode comprising an emission portion provided with the emission surface for emitting electrons, and a reservoir for holding a material, wherein the material, when heated, releases work function lowering particles that diffuse towards the emission portion and emanate at the emission surface at a first evaporation rate.

8. Arrangement according to claim 7, wherein the focusing electrode comprises a focusing surface for focusing electrons emitted from the emission surface and an adjustable heat source configured for keeping the focusing surface of the focusing electrode at a temperature at which accumulation of work function lowering particles on the focusing surface is prevented.

9. Arrangement according to claim 8, wherein the focusing electrode further comprises a heat trapping surface facing at least a portion of the cathode body and arranged for receiving heat radiation emitted by the cathode body during use, and wherein the heat trapping surface is in thermal communication with the focusing surface.

10. Arrangement according to claim 9, wherein the adjustable heat source is configured for heating the cathode body and wherein preferably the focusing surface is heated mainly via thermal radiation from the cathode body.

11. Arrangement according to claim 9, wherein the focusing electrode comprises a shell that surrounds the cathode body, the shell being provided with an inner surface, the inner surface or a portion thereof forming the heat trapping surface.

12. Arrangement according to claim 9, wherein a radial interspacing is defined between the heat trapping surface and an outer surface of the cathode body.

13. Arrangement according to claim 8, wherein the work function lowering particles comprise Barium, and wherein the adjustable heat source is configured for keeping the focusing surface temperature above 900 K and below 1300K.

14. Arrangement according to claim 8, wherein the focusing surface is provided with a coating suppressing electron emission.

15. Arrangement according to claim 8, wherein the adjustable heat source is arranged for heating the reservoir such that the work function lowering particles diffuse towards the emission portion and emanate at the emission surface at the first evaporation rate.

16. Arrangement according to claim 8, wherein the adjustable heat source comprises a heater cathode.

17. Arrangement according to claim 8, wherein the adjustable heat source is arranged within the cathode body or within a receptacle formed by the cathode body.

18. Arrangement according to claim 8, wherein the adjustable heat source is arranged to directly heat the focusing electrode.

19. Electron gun for generating an electron beam, the electron gun comprising:
    a cathode arrangement according to claim 1 for generating a plurality of electrons; and
    at least one shaping electrode for shaping the generated electrons into the electron beam.

20. Electron gun according to claim 19, comprising at least two shaping electrodes forming an aligned electrode assembly, the shaping electrodes each comprising a conducting body provided with a shaping aperture, the shaping apertures being coaxially aligned.

21. Electron beam lithography system for exposing a target using at least one electron beamlet, the system comprising:
    a beamlet generator for generating the at least one electron beamlet;
    a beamlet modulator for patterning the at least one electron beamlet to form at least one modulated beamlet;
    a beamlet projector for projecting the at least one modulated beamlet onto a surface of the target;
    wherein the beamlet generator comprises an electron gun according to claim 19.

* * * * *